United States Patent [19]
Lee et al.

[11] Patent Number: 5,619,454
[45] Date of Patent: *Apr. 8, 1997

[54] PROGRAMMING METHOD FOR HEALING OVER-ERASED CELLS FOR A FLASH MEMORY DEVICE

[75] Inventors: Roger Lee; Fernando Gonzalez, both of Boise, Id.

[73] Assignee: Micron Technology, Inc., Boise, Id.

[*] Notice: The term of this patent shall not extend beyond the expiration date of Pat. No. 5,568,959.

[21] Appl. No.: 519,275

[22] Filed: Aug. 25, 1995

Related U.S. Application Data

[63] Continuation-in-part of Ser. No. 412,815, Mar. 28, 1995, Pat. No. 5,508,959, which is a continuation of Ser. No. 152,809, Nov. 15, 1993, Pat. No. 5,424,993.

[51] Int. Cl.$^6$ .................................................. G11C 29/00
[52] U.S. Cl. ........................ 365/185.3; 365/185.09; 365/185.22; 365/200; 365/201
[58] Field of Search ........................... 365/185.3, 185.29, 365/185.33, 218, 200, 201, 185.22, 185.09

[56] References Cited

U.S. PATENT DOCUMENTS

| | | | |
|---|---|---|---|
| 4,279,024 | 7/1981 | Schrenk | 365/203 |
| 5,163,021 | 11/1992 | Mehrotra et al. | 365/185 |
| 5,233,559 | 8/1993 | Brennan, Jr. | 365/200 |
| 5,233,562 | 8/1993 | Ong et al. | 365/218 |
| 5,237,535 | 8/1993 | Mielke et al. | 365/218 |
| 5,272,669 | 12/1993 | Samachisa et al. | 365/185 |
| 5,335,198 | 8/1994 | Van Buskirk et al. | 365/185 |
| 5,424,993 | 6/1995 | Lee et al. | 365/218 |
| 5,508,959 | 4/1996 | Lee et al. | 365/185.3 |

OTHER PUBLICATIONS

Yamada et al, "A Self–Convergence Erasing Scheme For A Simple Stacked Gate Flash EEPROM", IEDM 1991, pp. 307–310.

Kazerounlan et al, "A 5 Volt High Density Poly–Poly Erase Flash EPROM Cell", IEM 1988, pp. 436–439.

*Primary Examiner*—Tan T. Nguyen

[57] ABSTRACT

A method for healing a plurality over-erased memory cells along a digit line comprises a accessing a number of control gates and accessing a digit line thereby activating the number of memory cells, each of the memory cells having a source, a drain, and a control gate. Subsequent to accessing the digit line, the presence of at least one over-erased activated cell the number of memory cells is sensed. Subsequent to sensing the presence of over-erased cells, a voltage of between about 4.0 volts and about 6.0 volts is applied to the digit line, a voltage between about 4.0 volts and about 6.0 volts is applied to the control gates of at least the over-erased cells, and a voltage of between about 0.0 volts and about 1.0 volts is applied to the source of the accessed cells. All over-erased cells along the digit line are thereby healed simultaneously.

27 Claims, 4 Drawing Sheets

| | DRAIN | SOURCE | CONTROL GATE |
|---|---|---|---|
| READ CELL | 1.0 V | TEST | 5.0 V |
| PROGRAM CELL | 6.0 V | 0.0 V | 12.0 V |
| ERASE CELL | FLOAT | 11.0 V | 0.0 V |
| SENSE CELL | 7.0 V (TEST FOR VOLTAGE DROP) | 0.0 V | FLOAT |
| HEAL CELL | 5.0 V | 0.0 V | 5.0 V |

|  | DRAIN | SOURCE | CONTROL GATE |
|---|---|---|---|
| READ CELL | 1.0 V | TEST | 5.0 V |
| PROGRAM CELL | 6.0 V | 0.0 V | 12.0 V |
| ERASE CELL | FLOAT | 11.0 V | 0.0 V |
| SENSE CELL | 7.0 V (TEST FOR VOLTAGE DROP) | 0.0 V | FLOAT |
| HEAL CELL | 5.0 V | 0.0 V | 5.0 V |

PROGRAMMING METHOD FOR HEALING OVER-ERASED CELLS FOR A FLASH MEMORY DEVICE

This is a continuation-in-part of Ser. No. 412,815, U.S. Pat. No. 5,508,959 filed Mar. 28 1995 and issued Apr. 16, 1995, which was a continuation Ser. No. 152,809, of U.S. Pat. No. 5,424,993, filed Nov. 15, 1993 and issued Jun. 13, 1995.

FIELD OF THE INVENTION

This invention relates in general to programmable read-only memory devices and more particularly to programming methods for programmable read-only memories.

BACKGROUND OF THE INVENTION

Erasable Programmable Read-only Memories (EPROMs), Electrically Erasable Programmable Read-only Memories ($E^2$PROMs), and Flash $E^2$PROMs (hereafter collectively, PROMs) have several structures which allow them to hold a charge without refresh for extended periods of time. FIG. 1 shows a top view of a PROM array, FIG. 2 shows a cross section along "AA" of FIG. 1, and FIG. 3 shows a cross section along "BB" of FIG. 1. The charge itself is stored on a "floating gate" 10 also referred to as Poly 1 or P1, which is a structure of polycrystalline silicon (hereafter, poly) surrounded on all sides by a layer of oxide 12. Located superjacent and parallel to this P1 structure is another poly structure, the "control gate" 14 or P2. P1 10 and P2 14 act as the two plates of a capacitor. Below the P1 layer are two N+ junctions, one which acts as the transistor source 16 and the other as the drain 18, which are doped into a P-type substrate 20. The portion of the substrate 20 between the source 16 and the drain 18 is the channel 22. The cell functions like an enhancement-type N-channel metal oxide semiconductor field effect transistor (MOSFET) with two gates of poly.

There are structures that make up a PROM array which are common to several transistors in the array. FIG. 1 shows the transistor sources 16, drains 18, digit lines 24, floating gates 10, and control or "word" lines 26 which form control gates 14 as they pass over the floating gates 10. Also shown as a dotted line is the "active area" 28 interspersed with areas of field oxide 30. A single word line 26 is common to all transistors in a single column acting as a control gate 14 for all transistors in the column. When the word line is selected it activates all transistors in the column. The source regions 16, which run parallel with the control lines 26, are common to all transistors in two adjacent columns. Individual transistor drains 18 are common to two transistors in adjacent columns. The digit (or bit) lines 24 are common with the drains 18 of all transistors in a single row.

The voltage potential which must be applied on the control gate to turn on the transistor is much higher in a device storing a charge (for example, storing -5 V) than in a device which does not have a potential stored on P1. To read the content of the floating gate, the source is tied to ground while the drain (by way of its digit line) is tied to a voltage, for example +1 V. A potential somewhere between the low and high potential values of the cell (i.e. the select voltage), for example +5 V, is applied to the control gate. A cell that does not conduct when the select voltage is applied to the control gate has a negative charge stored on P1, while a cell which does not have a negative charge stored on P1 will conduct heavily.

There are many ways to program a PROM. In one technique, a potential such as 12 V, for example, is applied on the control gate. Simultaneously, a voltage pulse, for example 6 V, is applied between source and drain. The large positive potential on the control gate establishes an electric field in the insulating oxide. This electric field generates the so-called "hot electron injection" of the transistor due to the high drain and control gate potentials, and injects the hot electrons into the floating gate. In this way the floating gate is charged, and the charge that accumulates on the floating gate becomes trapped.

Another programming method is by Fowler-Nordheim tunneling. By applying a high potential on the word line and grounding the source and/or the drain, electrons will tunnel through the thin gate oxide to the floating gate. Fowler-Nordheim tunneling is critically determined by the potential between the control gate and the source and/or drain (and therefore the electric field) and the thickness of the gate oxide.

To return the floating gate from a charged state to a state with no charge (erase), the electrons are caused to return to the substrate. In an EPROM, this is accomplished with ultraviolet light which excites the electrons past a certain energy state, thereby allowing them to pass through the oxide and return to the substrate. In an $E^2$PROM, this excitation is accomplished with an electrical field, for example by applying 11 V to the source and 0 V to the control gate while the drain is allowed to float. After erase, a device can be reprogrammed by placing a charge on those cells requiring a charge, and the remaining cells are not programmed.

One problem that can occur with floating gate devices is over-erase. Over-erase can occur when an excessive number of electrons stored on the floating gate of a programmed cell are removed, for example during a normal erase procedure. This can occur if the gate oxide under the floating gate is too thin, thereby decreasing the resistance to the flow of electrons through the gate oxide. Other mechanisms for over-erase are not yet known, however over-erase can be unpredictable and can be random from cell to cell. One cause of random over-erase may be the movement of holes through the gate oxide which makes the movement of electrons from the floating gate to the substrate during erase more efficient. Regardless of the cause of the over-erase, an over-erased cell will have a positively charged floating gate which can shift the threshold voltage close to 0.0 V or, in extreme cases, to a negative voltage.

A method of programming PROMs which corrects over-erased cells would be desirable.

SUMMARY OF THE INVENTION

A method for healing at least one over-erased memory cell having a source, a drain, and a control gate comprises the steps of accessing a number of control gates and accessing a digit line thereby activating the number of memory cells. Subsequent to accessing the digit line, the presence of at least one over-erased activated cell is sensed from the number of memory cells. Subsequent to sensing the presence of the over-erased cell, a first voltage is applied to the digit line, a second voltage is applied to the control gate of at least the over-erased cell, and a third voltage is applied to the source of at least the over-erased cell, the first and second voltages being higher than the third voltage.

Various objects and advantages will become apparent to those skilled in the art from the following detailed descrip-

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
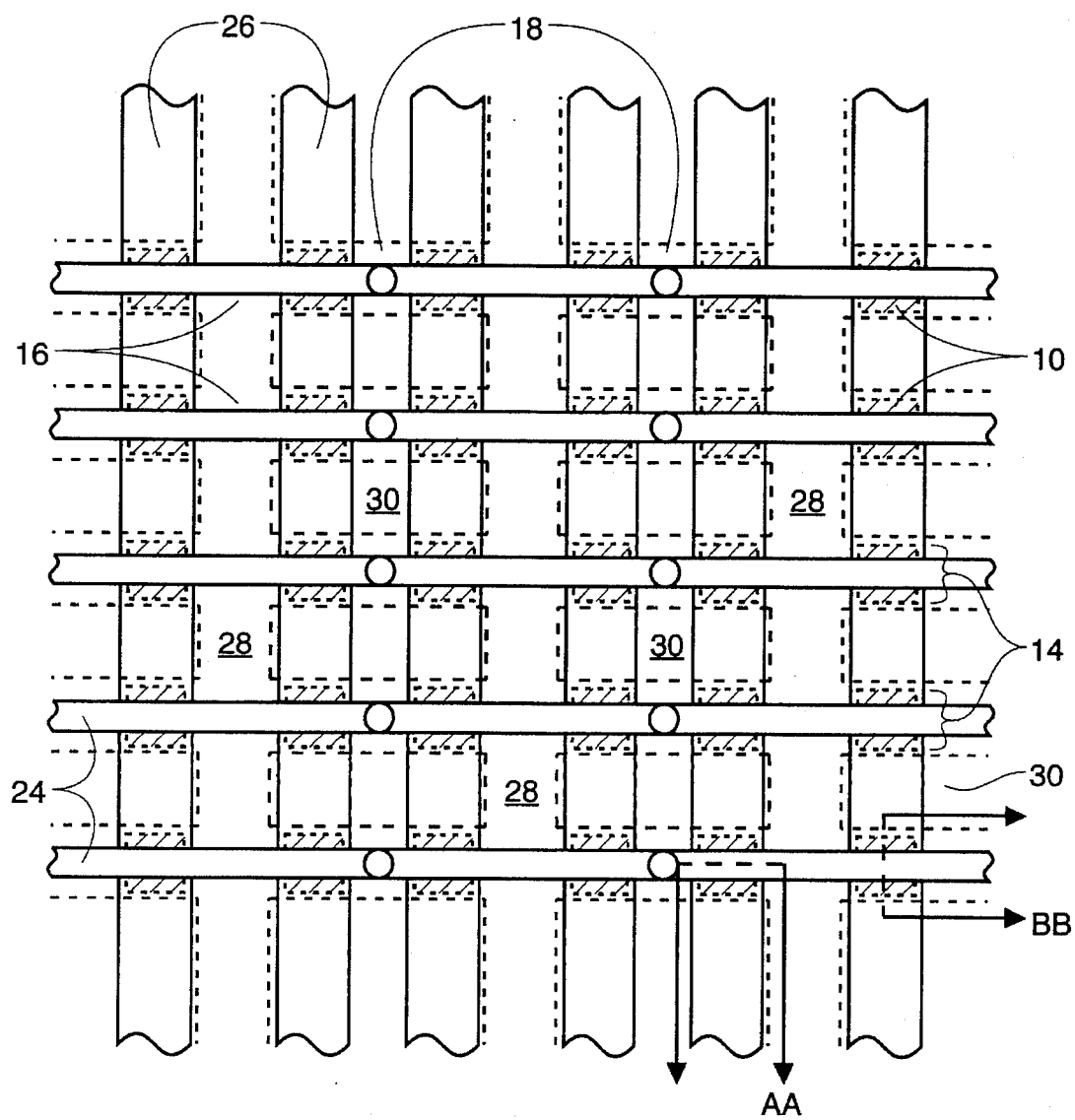
FIG. 1 is a top view of a PROM array.
Figure 2:
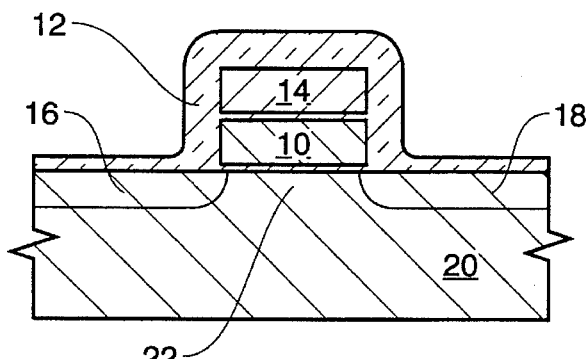
FIG. 2 is a cross section of the FIG. 1 PROM array along section "AA"
Figure 3:
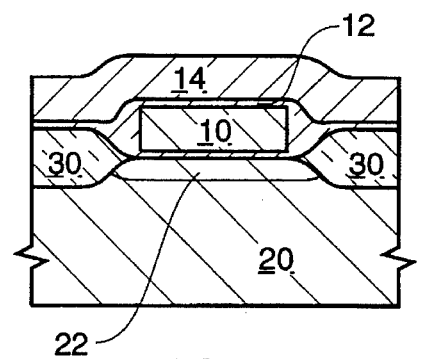
FIG. 3 is a cross section of the FIG. 1 PROM array along section "BB"
Figure 4:
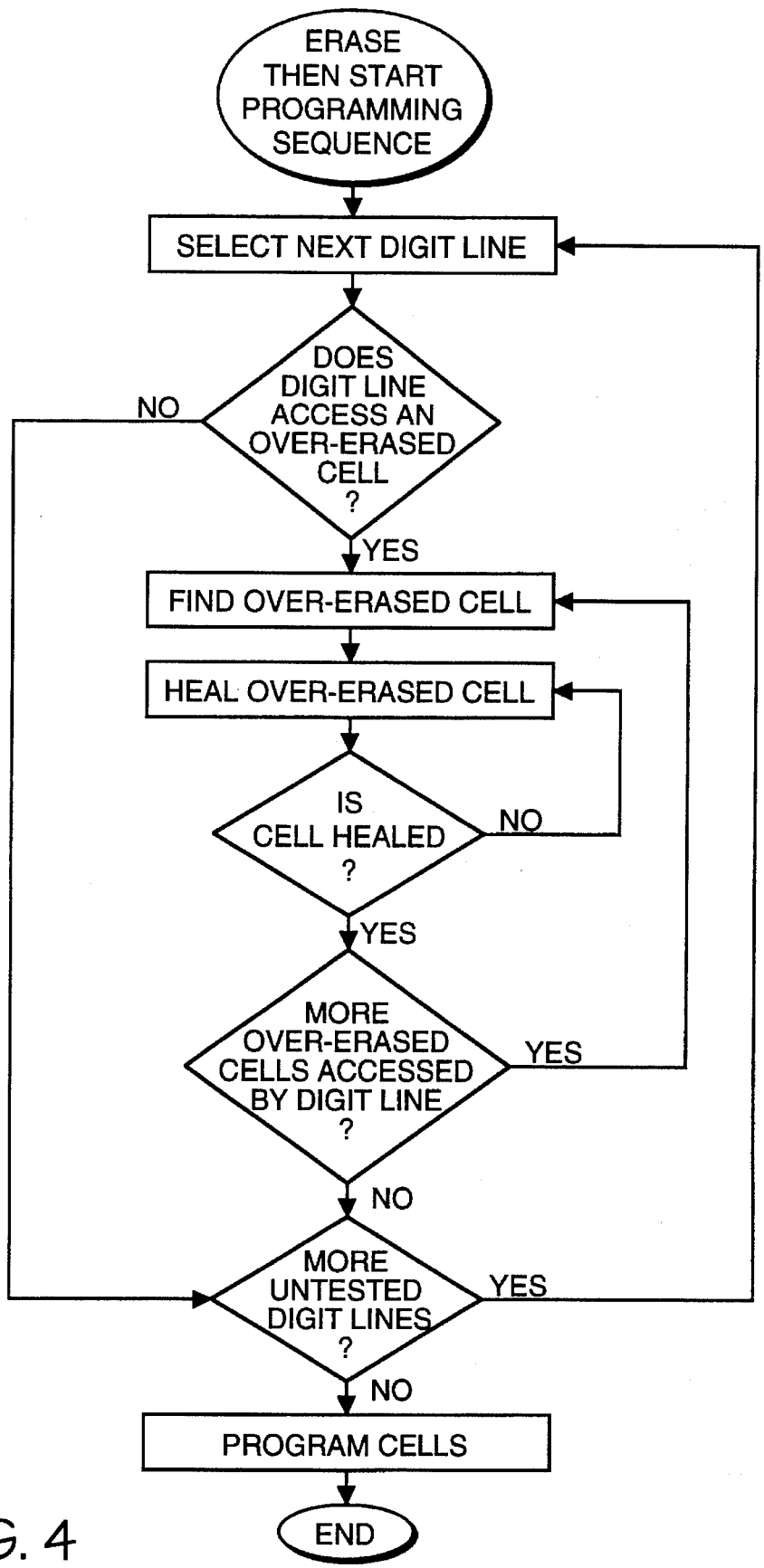
FIG. 4 is a flow chart showing one possible embodiment of the inventive method.

FIG. 4 is a flow chart showing the steps comprising an embodiment of the invention. After all cells are erased the programming sequence is started. Each digit line is sequentially selected, and it is determined if the digit line accesses any over-erased cells. All cells accessed by the digit line can be activated by first accessing all control gates and then accessing the digit line. As this would require a large amount of current, it may be more beneficial to first access less than all the control gates before accessing the digit line. For example, four control gates (a word) or eight control gates (a byte) could be accessed, then the digit line is accessed to determine if any of the eight activated cells are over-erased. The next eight control gates are then accessed, and the same digit line is accessed to activate a second group of eight cells accessed by that digit line. The flow chart shown in FIG. 4 and the text below describe the simultaneous activation of all cells accessed by one digit line, but the steps shown are easily modified by one of ordinary skill in the art to select a reduced number of cells, for example eight.

If the digit line voltage $V_D$ is 0 V, no activated over-erased cells are accessed by the digit line and the next digit line (or the next group of cells) is tested. If $V_D$ is positive, then at least one activated cell is over-erased. If an over-erased cell is activated, a "sense" voltage $V_{SENSE}$ is applied to each activated cell to determine if the cell is storing a positive voltage. $V_{SENSE}$ can be any voltage that would not turn on a cell storing 0 V but would turn on a cell storing a positive voltage. For example, applying about 7 V to the drain, about 0 V to the source, and allowing the control gate to float would turn on a cell storing a positive voltage, but would not turn on a cell storing 0 V. The 7 V on the drain is sensed, for example by a current sense amp. If the voltage on the drain does not drop the cell being sensed is not over-erased and the next activated cell accessed by the digit line is sensed. If the voltage on the drain drops (from being shorted through the cell to ground) the activated cell being tested is over-erased.

Once the over-erased cell is found, a "heal" voltage $V_H$ is applied to the cell. $V_H$ injects hot electrons onto the floating gate to counteract the positive voltage, but does not bias the floating gate enough to cause a negative charge to build on the floating gate. $V_H$ is applied only for a timed period, for example one microsecond to one millisecond. An example of the $V_H$ is to apply about 5 V to the drain and to the control gate, and about 0 V to the source. Other voltages may be used which do bias the floating gate, as timing $V_H$ ensures that very little negative voltage, if any, is stored on the floating gate. After $V_H$ is applied to the over-erased cell for the timed interval, $V_{SENSE}$ is reapplied to the cell to determine if it is healed. If the cell is still over-erased, $V_H$ is reapplied to the cell, then $V_{SENSE}$ is applied to the cell.

Once the over-erased cell is healed, the digit line is again tested to determine if there are additional over-erased activated cells accessed by the digit line. If so, they are healed, and if not the next untested digit line (if any exist) is tested. In any case, after the over-erased cells accessed by a particular digit line are healed the remaining digit lines are tested and the over-erased cells are healed.

After all the digit lines are tested and the over-erased cells are healed, the cells are programmed, for example by applying about 6.0 V to the drain, about 0.0 V to the source, and about 12.0 V to the control gate. Other programming voltages are well known in the art.

Figures 5, 6:
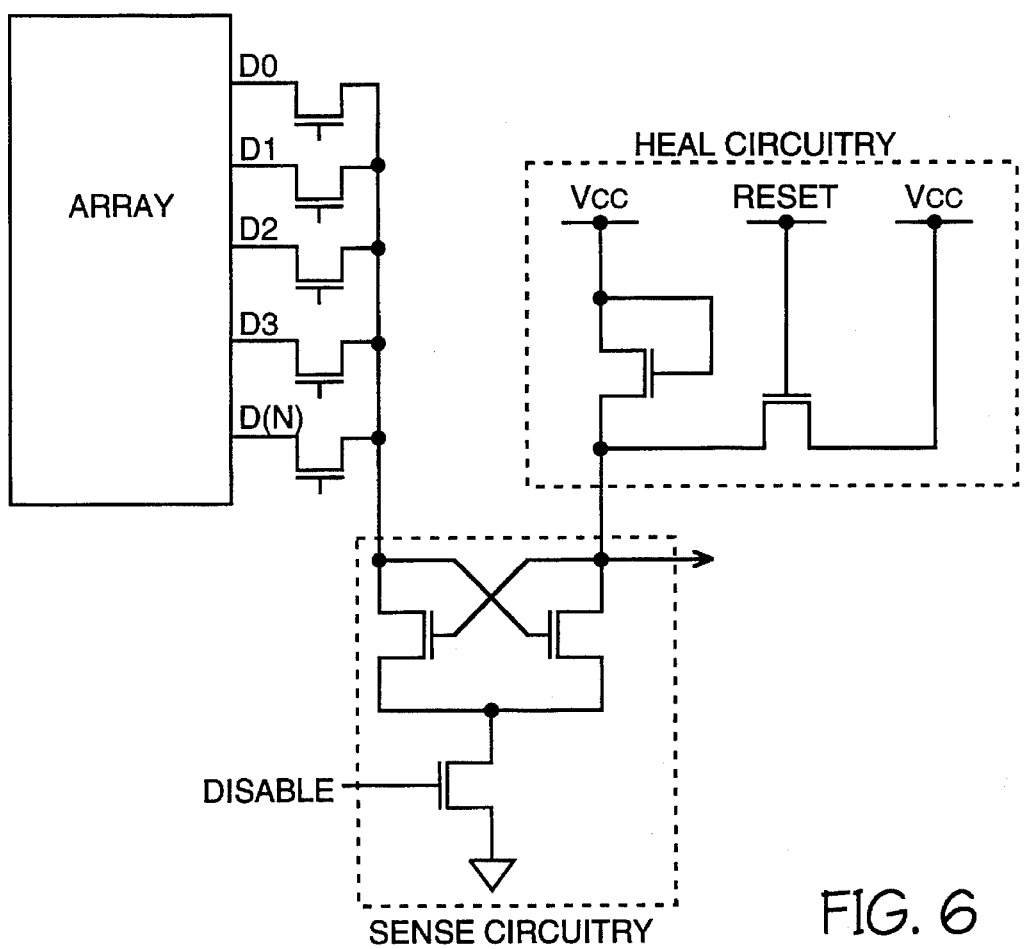
FIG. 5 is a table showing possible voltages associated with a flash PROM cell and with the inventive method.
FIG. 6 is one possible circuit for applying the inventive method to a PROM cell.

FIG. 5 shows a table of the various voltages associated with different modes of operation with a PROM cell such as a flash memory device. Various other voltages may function equally well. For example, the voltages may be different with a 3.3 V flash PROM design (although the voltages shown may function adequately with a 3.3 V design). Also, other voltages would function equally well with a 5 V design, for example the voltages listed plus or minus about 1.0 volt. Similarly, during a sense the control gate can be grounded, or could have another voltage applied thereto, rather than being allowed to float as shown.

FIG. 6 shows a circuit which can carry out the heal and sense modes. The circuit can be formed on the device itself or in logic off the device. Other circuits which carry out the operation as described are possible and likely.

With the inventive programming method, only those cells which are over-erased are healed. This is in contrast to a heal mode which applies a heal voltage to every cell without testing to determine if it is over-erased. Thus the inventive method as described reduces the current required to repair the cells over a method which heals all cells regardless of whether they are over-erased. Also, each digit line (or a byte of activated cells accessed by a digit line) is checked to determine if it accesses an over-erased bit. Very little time is added onto the programming sequence since in a typical array the majority of bits are not over-erased. Checking each digit line rather than each individual cell further reduces the test time. Finally, as each cell is healed individually, the voltage variation of the healed cells is reduced over a process which heals all cells simultaneously.

Figure 7:
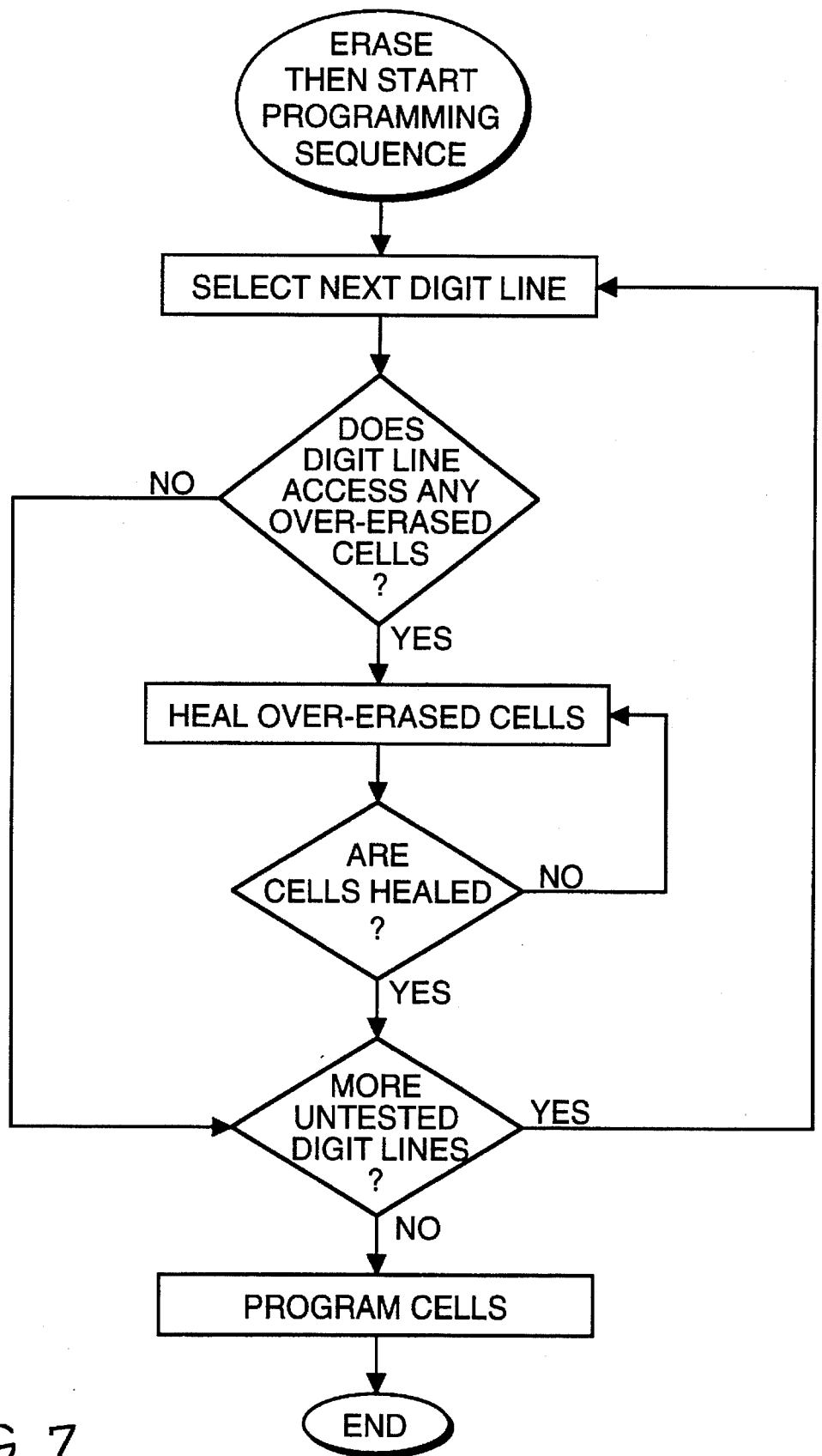
FIG. 7 is a flow chart showing a second embodiment of the invention.

FIG. 7 describes another embodiment of the invention. With this embodiment, each cell is not sensed to determine if it is over-erased, but instead a heal voltage is applied to all cells along a given digit line to heal the over-erased cells. The cells which are not over-erased are unaffected. With this embodiment of the inventive method for healing an over-erased memory cell (referring to FIG. 7) the array is erased then the programming sequence is begun. All the control gates in an array are accessed, then the first digit line is accessed to activate the memory cells in the array. In another embodiment, four, eight, or any other number of control gates which is less than all the control gates in the array are accessed, which accesses a reduced number of memory cells. This embodiment may require less current.

After the memory cells are accessed the digit line is sensed for the presence of at least one over-erased activated cell using $V_{SENSE}$ as described (for example by a sense amplifier to detect a voltage or current drop on the digit line). If there are no over-erased cells detected, the next digit line is selected. If over-erased cells are detected $V_H$ is applied to the digit line, to the control gates of all activated cells, and to the sources of the activated cells. Applying the heal voltage to the digit line and all cells accessed by the digit line stores electrons on the floating gates of the over-erased cells while the cells which are not over-erased remain unaffected. Subsequently, the cells along the digit line are again sensed to determine whether any accessed memory cells along the digit line remain over-erased. Responsive to at least one cell remaining over-erased, the heal and sense steps are repeated.

As described previously, the heal voltage can be applied for a timed interval, for example between about one microsecond and about one millisecond. Alternately, the heal voltage can be applied for a sufficient length of time to ensure the over-erased cells are healed, thereby avoiding the need to reexamine the digit line for over-erased cells.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for healing at least one over-erased memory cell, comprising:
   a) accessing a number of control gates and accessing a digit line thereby activating said number of memory cells, each of said memory cells having a source, a drain, and a control gate;
   b) subsequent to accessing said digit line, sensing the presence of at least one over-erased activated cell from said number of memory cells;
   c) subsequent to sensing the presence of said over-erased cell, applying a first voltage to said digit line, a second voltage to said control gate of at least said over-erased cell, and a third voltage to said source of at least said over-erased cell, said first and second voltages being higher than said third voltage.

2. The method of claim 1 wherein electrons are stored on said a floating gate of at least said over-erased memory cell during said step of applying said voltages.

3. The method of claim 1, further comprising
   a) subsequent to said step of applying said voltages, sensing whether any memory cells from said number of cells remain over-erased;
   b) responsive to sensing at least one cell which remains over-erased, repeating said step of applying said voltages and said step of sensing whether any memory cells remain over-erased.

4. The method of claim 1 wherein said first and second voltages are in the range of about 4.0 volts to about 6.0 volts, and said third voltage is in the range of about 0.0 volts to about 1.0 volt.

5. The method of claim 1 wherein the presence of said over-erased cell is sensed by applying between about 6.0 volts and about 8.0 volts to said drain of said over-erased cell and between about 0.0 volts and about 1.0 volts to said source of said over-erased cell.

6. The method of claim 1 wherein said over-erased memory cell is sensed by sensing said accessed digit for a voltage drop.

7. The method of claim 1 wherein said over-erased memory cell is sensed by sensing said accessed digit for a current drop.

8. The method of claim 1 wherein said control gate floats while said over-erased cell is being sensed.

9. The method of claim 1 wherein said control gate is grounded while said over-erased cell is being sensed.

10. The method of claim 1 wherein said voltages are for a timed interval.

11. The method of claim 10 wherein said timed interval is between about one microsecond and one millisecond.

12. A method for healing a plurality over-erased memory cells along a digit line, comprising:
   a) accessing a number of control gates and accessing a digit line thereby activating said number of memory cells, each of said memory cells having a source, a drain, and a control gate;
   b) subsequent to accessing said digit line, sensing the presence of at least one over-erased activated cell from said number of memory cells;
   c) subsequent to sensing the presence of over-erased cells, applying a first voltage to said digit line, a second voltage to said control gates of at least said over-erased cells, and a third voltage to said source of at least said plurality of over-erased cells, said first and second voltages being higher than said third voltage.

13. The method of claim 12 wherein electrons are stored on a floating gate of each said over-erased cells during said step of applying said voltages.

14. The method of claim 12, further comprising
   a) subsequent to said step of applying said voltages, sensing whether any memory cells from said number of cells remain over-erased;
   b) responsive to sensing cells which remain over-erased, repeating said step of applying said voltages and said step of sensing whether any memory cells remain over-erased.

15. The method of claim 12 wherein said first and second voltages are in the range of about 4.0 volts to about 6.0 volts, and said third voltage is in the range of about 0.0 volts to about 1.0 volt.

16. The method of claim 12 wherein the presence of said over-erased cell is sensed by applying between about 6.0 volts and about 8.0 volts to said drain of said over-erased cell and between about 0.0 volts and about 1.0 volts to said source of said over-erased cell.

17. The method of claim 12 wherein said over-erased memory cell is sensed by sensing said accessed digit for a voltage drop.

18. The method of claim 12 wherein said over-erased memory cell is sensed by sensing said accessed digit for a current drop.

19. The method of claim 12 wherein said control gate floats while said over-erased cell is being sensed.

20. The method of claim 12 wherein said control gate is grounded while said over-erased cell is being sensed.

21. The method of claim 12 wherein said voltages are for a timed interval.

22. The method of claim 21 wherein said timed interval is between about one microsecond and about one millisecond.

23. The method of claim 12 wherein said applying said voltages heals said plurality of said over-erased memory cells along said digit line.

24. A method for healing a plurality over-erased memory cells along a digit line, comprising:

a) accessing a number of control gates and accessing a digit line thereby activating said number of memory cells, each of said memory cells having a source, a drain, and a control gate;

b) subsequent to accessing said digit line, sensing the presence of at least one over-erased activated cell from said number of memory cells;

c) subsequent to sensing the presence of over-erased cells, applying a voltage between about 4.0 volts and about 6.0 volts to said digit line, a voltage between about 4.0 volts and about 6.0 volts to said control gates of at least said over-erased cells, and a voltage of between about 0.0 volts and about 1.0 volts to said source of said accessed cells;

d) subsequent to said step of applying said voltages, sensing whether any memory cells from said number of cells remain over-erased.

25. The method of claim 24 wherein at least one over-erased cell is sensed subsequent to applying said voltages, further comprising repeating said step of applying said voltages and said step of sensing whether any memory cells remain over-erased.

26. The method of claim 24 wherein electrons are simultaneously stored on a floating gate of each of said plurality of over-erased cell during said step of applying said voltages.

27. The method of claim 24 wherein the presence of said over-erased cell is sensed by applying between about 6.0 volts and about 8.0 volts to said drain of said over-erased cell and between about 0.0 volts and about 1.0 volts to said source of said over-erased cell.

* * * * *

UNITED STATES PATENT AND TRADEMARK OFFICE
CERTIFICATE OF CORRECTION

PATENT NO. : 5,619,454
DATED : April 8, 1997
INVENTOR(S) : Lee et al.

It is certified that error appears in the above-indentified patent and that said Letters Patent is hereby corrected as shown below:

Column 1, line 31 please delete "P 110" and insert -- P1 10 --.

Column 1, line 57 please delete "storing-5 V" and insert -- storing -5V --.

Signed and Sealed this

Fifth Day of August, 1997

Attest:

BRUCE LEHMAN

*Attesting Officer*                *Commissioner of Patents and Trademarks*